(12) United States Patent
Cho et al.

(10) Patent No.: US 11,005,569 B1
(45) Date of Patent: May 11, 2021

(54) OPTICAL TRANSMITTER HAVING CASCADED MODULATORS

(71) Applicant: Nokia Solutions and Networks OY, Espoo (FI)

(72) Inventors: Joon Ho Cho, Holmdel, NJ (US); Xi Chen, Aberdeen, NJ (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 17/005,391

(22) Filed: Aug. 28, 2020

(51) Int. Cl.
| | |
|---|---|
| *H04B 10/516* | (2013.01) |
| *H04Q 11/00* | (2006.01) |
| *H04B 10/25* | (2013.01) |
| *H04B 10/50* | (2013.01) |
| *H03M 1/74* | (2006.01) |

(52) U.S. Cl.
CPC ......... *H04B 10/516* (2013.01); *H04B 10/25* (2013.01); *H04B 10/505* (2013.01); *H04Q 11/0005* (2013.01); *H03M 1/74* (2013.01); *H04Q 2011/0039* (2013.01)

(58) Field of Classification Search
CPC .............. H04B 10/516; H04B 10/5161; H04B 10/5051
See application file for complete search history.

(56) References Cited

U.S. PATENT DOCUMENTS

| | | | |
|---|---|---|---|
| 6,650,846 B1 | 11/2003 | Ito | |
| 9,900,021 B1 * | 2/2018 | Elliott | ............. G02F 7/00 |
| 10,091,046 B1 | 10/2018 | Lefevre | |

(Continued)

FOREIGN PATENT DOCUMENTS

| | | | | |
|---|---|---|---|---|
| WO | WO2010/012316 | * | 2/2010 | ............. H04L 27/20 |
| WO | WO2016/092666 | * | 6/2016 | ............ H04B 10/516 |

OTHER PUBLICATIONS

Lu, Guo-Wei. "Flexible high-order quadrature amplitude modulation transmitter for elastic optical networks." 2015 Optoelectronics Global Conference (OGC). IEEE, Shenzhen, China (2015): 1-2.

(Continued)

*Primary Examiner* — Nathan M Cors
(74) *Attorney, Agent, or Firm* — Mendelsohn Dunleavy, P.C.; Yuri Gruzdkov

(57) ABSTRACT

An optical data transmitter comprising two or more serially connected optical modulators, each driven using a respective DAC. The digital signals applied to the individual DACs are produced using different respective subsets of the set of bitstreams representing the digital waveform or data stream to be transmitted, with the bitstream subsets being selected, e.g., such that (i) each of the individual DACs is able to support the digital resolution and sampling rate needed for properly handling the subset of bitstreams applied thereto and (ii) differences between average driving powers applied to different optical modulators are relatively small. In different embodiments, the two or more serially connected optical modulators can be arranged for generating optical communication signals of different modulation formats, e.g., PSK, ASK, PAM, IM, and QAM. Some embodiments can advantageously be used for generating optical communication signals employing constellations of relatively large sizes, e.g., larger than 1000 symbols.

17 Claims, 4 Drawing Sheets

(56) References Cited

U.S. PATENT DOCUMENTS

| | | |
|---|---|---|
| 10,411,807 B1 | 9/2019 | Earnshaw et al. |
| 2003/0142384 A1* | 7/2003 | Kurebayashi ........ H04B 10/505 359/237 |
| 2003/0170035 A1 | 9/2003 | Kisaka et al. |
| 2003/0175037 A1* | 9/2003 | Kimmitt ............... G02F 1/0123 398/198 |
| 2005/0013385 A1 | 1/2005 | Atkinson |
| 2006/0171723 A1 | 8/2006 | Bigo et al. |
| 2017/0134096 A1* | 5/2017 | Zheng .............. H04B 10/50575 |
| 2018/0054257 A1 | 2/2018 | Witzens et al. |

OTHER PUBLICATIONS

Tanizawa, Ken, et al. "Single-channel 48-Gbit/s DP PSK Y-00 quantum stream cipher transmission over 400-and 800-km SSMF." Optics Express 27.18 (2019): 25357-25363.

Yoshida, Masato, et al. "Single-channel 40 Gbit/s digital coherent QAM quantum noise stream cipher transmission over 480 km." Optics Express 24.1 (2016): 652-661.

* cited by examiner

100

210

220

230

400

OPTICAL TRANSMITTER HAVING CASCADED MODULATORS

BACKGROUND

Field

Various example embodiments relate to optical communication equipment and, more specifically but not exclusively, to optical transmitters.

Description of the Related Art

This section introduces aspects that may help facilitate a better understanding of the disclosure. Accordingly, the statements of this section are to be read in this light and are not to be understood as admissions about what is in the prior art or what is not in the prior art.

A fiber-optic communication system typically employs an optical data transmitter at one end of an optical fiber line and an optical data receiver at the other end of the optical fiber line. The telecom industry and its suppliers develop, manufacture, sell, and use a large variety of optical data transmitters and receivers for many different communications applications.

SUMMARY OF SOME SPECIFIC EMBODIMENTS

Disclosed herein are various embodiments of an optical data transmitter comprising two or more serially connected optical modulators, each driven using a respective digital-to-analog converter (DAC). The digital signals applied to the individual DACs are produced using different respective subsets of the set of bitstreams representing the digital waveform or data stream to be transmitted, with the bitstream subsets being selected such that, e.g., (i) each of the individual DACs is able to support the digital resolution and sampling rate needed for properly handling the subset of bitstreams applied thereto and (ii) differences between average driving powers applied to different ones of the serially connected optical modulators can be relatively small. In some embodiments, the latter characteristic can advantageously be used, e.g., to relax at least some of the transmitter circuits constraints and/or to improve the transmitter operability and calibration procedures.

In different embodiments, the two or more serially connected optical modulators can be arranged for generating optical data signals of different modulation formats, e.g., Phase Shift Keying (PSK), Amplitude Shift Keying (ASK), Pulse Amplitude Modulation (PAM), Intensity Modulation (IM), and Quadrature Amplitude Modulation (QAM). Some embodiments can advantageously be used for generating optical data signals employing constellations of relatively large sizes, e.g., larger than 250 symbols or even larger than 1000 symbols.

According to an example embodiment, provided is an apparatus comprising an optical data transmitter that comprises first and second optical modulators and an electrical drive circuit, the first and second optical modulators being serially connected to generate a modulated optical signal in response to a first electrical drive signal applied to the first optical modulator and to a second electrical drive signal applied to the second optical modulator; wherein the electrical drive circuit is configured to generate the first electrical drive signal using a first subset of an ordered set of parallel bitstreams and to generate the second electrical drive signal using a second non-overlapping subset of the ordered set, an order of the set being according to significance of the bitstreams to distances between data symbols carried by the modulated optical signal; and wherein one of the first and second subsets includes two of the bitstreams separated in said order by at least one bitstream from another one of the first and second subsets.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Higher-order modulation can advantageously be used to increase the effective data-transmission rate. For example, the Quadrature-Phase-Shift-Keying (QPSK) format (which can carry two bits per symbol) was used at the onset of coherent optical transmission. Later, optical 16-ary Quadrature Amplitude Modulation (16-QAM, which can carry four bits per symbol) became an often-used modulation format. Presently, the 64-QAM modulation format (which can carry six bits per symbol) is being used in some optical-communications applications. It is believed that this general trend toward larger constellation sizes will continue, at least in the near future, to meet the market demands with respect to optical data-transmission volume and throughput.

Optical modulation employing a relatively large constellation can be implemented using a digital-to-analog converter (DAC) having an appropriately high resolution that enables reliable generation of and switching between multiple discrete signal levels at a desired rate. However, some large constellations may currently be beyond the technical capability of even a state-of-the-art single DAC at high symbol rates, e.g., at least for DACs implemented using the complementary metal-oxide-semiconductor (CMOS) technology.

The above and possibly some other related problems in the state of the art can be addressed, e.g., using at least some embodiments disclosed herein. In an example embodiment, an optical data transmitter comprises two or more serially connected optical modulators, each driven using a corresponding dedicated DAC. The digital signals applied to the individual DACs are produced using different respective subsets of the set of bitstreams representing the digital waveform to be transmitted, with the bitstream subsets being selected, e.g., such that (i) each of the individual DACs has sufficient digital resolution and sampling rate needed for properly handling the subset of bitstreams applied thereto and (ii) differences between average driving powers applied to different ones of the serially connected optical modulators can be made relatively small. The latter characteristic can advantageously be used, e.g., to relax at least some of the"

chip-manufacturing constraints and/or to improve the transmitter operability and calibration procedures.

Figure 1:
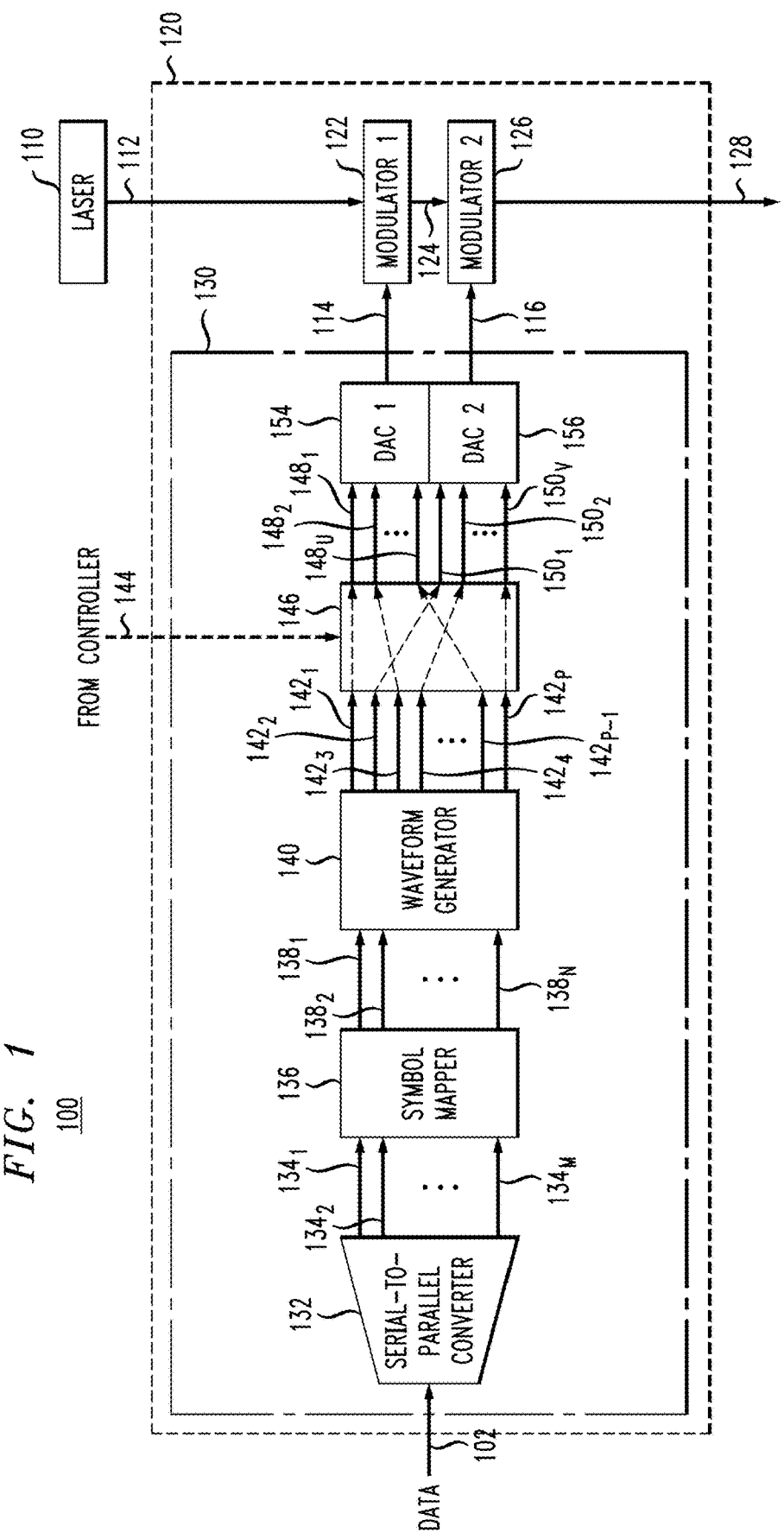
FIG. 1 shows a block diagram of an optical data transmitter according to an embodiment.

FIG. 1 shows a block diagram of an optical data transmitter 100 according to an embodiment. Transmitter 100 comprises a laser 110 and an optical modulator 120. In operation, laser 110 generates an optical carrier 112 in a conventional manner. Optical modulator 120 then modulates optical carrier 112 in response to an input data signal 102, thereby generating a modulated optical output signal 128 having encoded thereon the data supplied by the input data signal. In an example embodiment, the input data signal 102 can be an electrical binary signal comprising a sequence of binary "zeros" and "ones." The modulated optical output signal 128 can be applied, e.g., to an optical fiber line for transmission therethrough to a remote optical data receiver (not explicitly shown in FIG. 1).

Optical modulator 120 comprises serially connected optical modulators 122 and 126 and an electrical drive circuit 130. Optical modulator 122 operates to modulate optical carrier 112 in response to an electrical drive signal 114 applied thereto by drive circuit 130, thereby generating a corresponding modulated optical signal 124. Optical modulator 126 operates to further modulate optical signal 124 in response to an electrical drive signal 116 applied thereto by drive circuit 130, thereby generating the modulated optical output signal 128. Electrical drive signals 114 and 116 can be generated by drive circuit 130 in response to the input data signal 102, e.g., as described below. Depending on the embodiment, optical modulators 122 and 126 can be amplitude modulators, phase modulators, intensity modulators, etc.

In an example embodiment, electrical drive circuit 130 comprises a serial-to-parallel (S/P) converter 132, a symbol mapper 136, a digital waveform generator 140, a bitstream router 146, and DACs 154 and 156 interconnected as indicated in FIG. 1.

S/P converter 132 is configured to convert the input data signal 102 into M parallel bitstreams, which are labeled in FIG. 1 using the reference numerals $134_1$-$134_M$, where M is an integer greater than one. In an example embodiment, the conversion process can be implemented in S/P converter 132 in accordance with the following example processing steps: (step 1) receiving M bit values by way of the input data signal 102; (step 2) directing the first of the M received bit values to bitstream $134_1$; (step 3) directing the second of the M received bit values to bitstream $134_2$; ...; and (step M+1) directing the M-th of the M received bit values to bitstream $134_M$. The processing steps (1) through (M+1) may be repeated, e.g., for each period of M clock cycles of the input data signal 102. Due to the deserialization performed in this manner, the bitstreams $134_1$-$134_M$ may be clocked at a lower rate than the input data signal 102. In each clock cycle thereof, the bitstreams $134_1$-$134_M$ provide a corresponding bit-word, A(k), to symbol mapper 136, where k is the time-slot index. Each bit-word A(k) has M bits carried by the bitstreams $134_1$-$134_M$, respectively, in the k-th clock cycle.

In an example embodiment, symbol mapper 136 can be programmed based on a selected one-dimensional constellation. In operation, symbol mapper 136 converts each bit-word A(k) into a corresponding bit-word S(k), which represents the corresponding constellation symbol of the selected one-dimensional constellation. Each of the bit-words S(k) generated in this manner has N bits, where N is an integer, and N≥M. Using this constellation-based mapping, any bit-word A(k) provided by the bitstreams $134_1$-$134_M$ in a k-th time slot can be converted into a corresponding bit-word S(k), with the N bit values thereof being applied to bitstreams $138_1$-$138_N$, respectively, in the k-th time slot thereof. In some embodiments, symbol mapper 136 can be implemented using a look-up table (LUT) having $2^M$ entries, wherein each M-bit value is linked with a corresponding unique N-bit value.

Figure 2A:
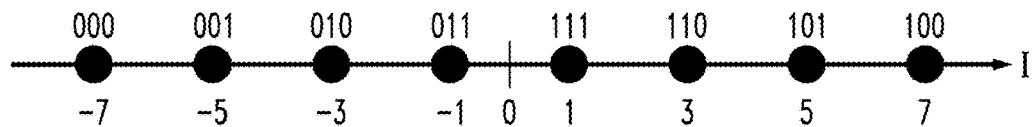
FIGS. 2A-2C show different examples of a one-dimensional constellation based on which a symbol mapper used in the optical data transmitter of FIG. 1 can be programmed in some embodiments.
Figure 2B:
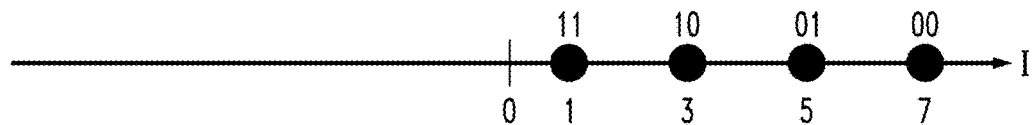
Figure 2C:
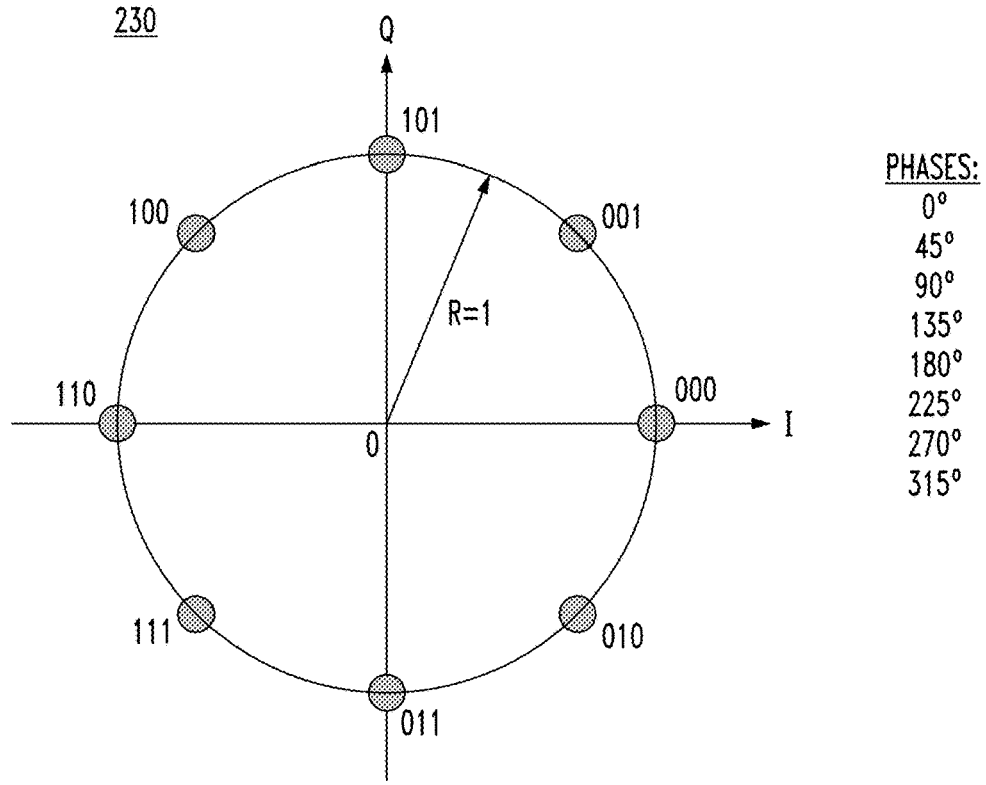

FIGS. 2A-2C show different examples of the one-dimensional constellation based on which symbol mapper 136 can be programmed in some embodiments. A person of ordinary skill in the art will understand that other one-dimensional constellations can similarly be used to program symbol mapper 136 in other embodiments.

FIG. 2A graphically illustrates an 8-ary Pulse-Amplitude-Modulation (8-PAM) constellation 210 that can be used to program symbol mapper 136 according to an embodiment. The eight constellation points of constellation 210 are all located on the I-axis of the complex I-Q plane. Each of the constellation points is used to encode three bits, i.e., M=3. An example of 3-bit bit-words assigned to different constellation points of constellation 210 is shown above the I-axis in FIG. 2A. The relative amplitudes corresponding to the different constellation points of constellation 210 are shown below the I-axis in FIG. 2A and can be represented by the real numbers −7, −5, −3, −1, +1, +3, +5, and +7. A person of ordinary skill in the art will understand that constellation 210 can be used, e.g., in an embodiment of transmitter 100 in which optical modulators 122 and 126 are both amplitude modulators.

In the illustrated embodiment, the constellation-point labeling is in accordance with a reflected double-Gray mapping scheme, in which the constellation points located in the positive I-half of constellation 210 have binary-amplitude labels (i.e., the labels that do not include the sign bit) generated using conventional double-Gray mapping, while the constellation points located in the negative I-half of the constellation have binary labels generated by flipping the sign bits of the corresponding constellation points located in the positive I-half. With this type of mapping, the amplitude labels of the constellation points are symmetric, and the sign bits of the constellation points are anti-symmetric with respect to the origin of the I-axis. In some alternative embodiments, a similar approach can be used to generate binary labels for a constellation or a constellation portion that uses the Q dimension of the complex I-Q plane.

FIG. 2B graphically illustrates a unipolar 4-PAM constellation 220 that can be used to program symbol mapper 136 according to another embodiment. The four constellation points of constellation 210 are all located in the positive half of the I-axis. Each of the constellation points is used to encode two bits, i.e., M=2. The 2-bit bit-words assigned to different constellation points of constellation 220 are shown above the I-axis in FIG. 2B. The relative amplitudes corresponding to the different constellation points of constellation 220 are shown below the I-axis in FIG. 2B and can be represented by the real numbers +1, +3, +5, and +7. A person of ordinary skill in the art will understand that constellation 220 can be used, e.g., in an embodiment of transmitter 100 in which optical modulators 122 and 126 are both intensity modulators.

FIG. 2C graphically illustrates an 8-ary Phase-Shift-Keying (8-PSK) constellation 230 that can be used to program symbol mapper 136 according to yet another embodiment. The eight constellation points of constellation 230 are all located on a circle having a radius R=1 and centered on the origin of the complex I-Q plane. Each of the constellation points is used to encode three bits, i.e., M=3. The 3-bit bit-words assigned to different constellation points of constellation 230 are shown next to the constellation points in FIG. 2C. This particular constellation-point labeling is in accordance with Gray mapping. The relative phases corresponding to the different constellation points of constellation 210 are listed in the legend shown in FIG. 2C and can be represented by the real numbers 0, 45, 90, 135, 180, 225, 270, and 315. A person of ordinary skill in the art will understand that constellation 230 can be used, e.g., in an embodiment of transmitter 100 in which optical modulators 122 and 126 are both phase modulators.

Referring back to FIG. 1, digital waveform generator 140 is configured to convert the sequence of bit-words S(k) supplied by way of bitstreams $138_1$-$138_N$ into a corresponding digital waveform W(j) suitable for driving the employed type of optical modulators 122 and 126, where j is the time-slot index. Each of the bit-words of the digital waveform W(j) generated in this manner has P bits, where P is an integer, and P≥N. Using the processing performed in the digital waveform generator 140, each bit-word S(k) provided by the bitstreams $138_1$-$138_N$ in a k-th time slot can be converted into one or more corresponding bit-words W(j), with the P bit values of each bit-word W(j) being applied to bitstreams $142_1$-$142_P$, respectively, in the j-th time slot thereof. The indices p (where p=1, 2, . . . , P) indicate the ordering of bits of the bit-words W(j) in the order of relative bit significance. For example, the bitstream $142_1$ can carry the most significant bits (MSBs) of the bit-words W(j). In some embodiments, the MSB can be a sign bit. The bitstream $142_2$ can carry the second most significant bits of the bit-words W(j), and so on. The bitstream $142_P$ can carry the least significant bits (LSBs) of the bit-words W(j). In an example embodiment, the number P can be greater than two. The upper limit on the number P typically depends on the digital resolution(s) supported by the DACs 154 and 156.

Herein, a first bitstream is more significant than a second bitstream, e.g., because, in response to a variation of a value of the first bitstream, transmitter 100 is able to produce a larger distance between some data symbols modulated onto an optical carrier than in response to a variation of a value of the second bitstream. As an example, FIG. 2A shows a mapping of triplets of binary digits onto data symbols carried by an optical carrier. For such a mapping, a variation of the bitstream for the left-most binary digit of the triplets can produce a maximum distance of 14 between such data symbols. For comparison, a variation of the bitstream for the center binary digit of the triplets can produce a maximum distance of 4 between such data symbols. For further comparison, a variation of the bitstream for the right-most binary digit of the triplets can produce a maximum distance of 2 between such data symbols. Thus, for the shown mapping, the bitstream of the let-most digit of the triplets is the most significant, the bitstream of the right-most digit of the triplets is the least significant, and the bitstream of the center digit of the triplets has a relative significance between those of the other two bitstreams.

In an example embodiment, the processing implemented in the digital waveform generator 140 may include one or more digital-processing operations from the following non-exclusive list: (i) scaling; (ii) interpolation; (iii) oversampling; (iv) pulse shaping; (v) pre-distortion; and (vi) pre-compensation. These digital-processing operations can be implemented, e.g., in a conventional manner, as known to persons of ordinary skill in the pertinent art. For example, a scaling operation may include multiplication of a digital value by a selected multiplication factor. An interpolation operation may include obtaining one or more additional digital values (bit-words) based on the digital values provided by two or more bit-words S(k) corresponding to different time-slot indices k, the additional digital values being estimates of the function S(t) corresponding to the function S(k), where t is allowed to have intermediate values in a range between said different time indices k. Unlike the time-slot indices k, the time t used for the function S(t) is not necessarily integer valued, i.e., can be real-valued. A pulse-shaping operation may include constructing and/or changing a pulse-shaped waveform, e.g., to make the resulting optical signal 128 better suited for transmission through the corresponding optical communication channel. An oversampling operation may include increasing the number of output digital samples compared to the number of input digital samples. Oversampling is typically used together with interpolation and/or pulse shaping and results in the output bitstreams $142_1$-$142_P$ that are clocked at a higher rate than the corresponding input bitstreams $138_1$-$138_N$. This feature is already indicated above by the use of differently labeled respective time-slot indices, i.e., k versus j, for the streams of bit-words S(k) and W(j), respectively. A pre-distortion operation may involve changing a digital waveform in a manner that counteracts signal distortions imposed by the optoelectronic front end of transmitter 100. For example, such signal distortions may be caused by a nonlinearity of the transfer function(s) of one or both of optical modulators 122 and 126. A pre-compensation operation may involve changing a digital waveform in a manner that counteracts signal distortions imposed by the corresponding optical communication channel. An example pre-compensation operation may be directed at substantially cancelling, at the remote optical data receiver, the effects of chromatic dispersion in the optical fiber line connecting the remote optical data receiver to transmitter 100.

Bitstream router 146 operates to: (i) direct a first subset of bitstreams $142_1$-$142p$ to DAC 154; and (ii) direct a second subset of bitstreams $142_1$-$142p$ to DAC 156. In an example embodiment, the first and second subsets are non-overlapping, i.e., have no bitstreams 142 in common. In one embodiment, the first and second subsets combined together have all of the bitstreams $142_1$-$142p$, i.e., no bitstream 142 is dropped by bitstream router 146. In another embodiment, at least one bitstream 142 may be dropped by bitstream router 146. The bitstreams of the first subset are labeled in FIG. 1 using the reference numerals $148_1$-$148_U$. The bitstreams of the second subset are labeled in FIG. 1 using the reference numerals $150_1$-$150_V$. Herein, U and V are positive integers, and U+V ≤P.

The indices u (where u=1, 2, . . . , U) order the bitstreams $148_1$-$148_U$ to preserve the relative significance of the corresponding bitstreams that exists in the bitstream set $142_1$-$142_P$. For example, bitstream $148_1$ has relatively more-significant bits than bitstream $148_2$. Bitstream $148_2$ has relatively more-significant bits than bitstream $148_3$, and so on. Similarly, the indices v (where v=1, 2, . . . , V) order the bitstreams $150_1$-$150_V$ to preserve the relative significance of the corresponding bitstreams that exists in the bitstream set $142_1$-$142_P$. For example, bitstream $150_1$ has relatively more-significant bits than bitstream $150_2$. Bitstream $150_2$ has relatively more-significant bits than bitstream $150_3$, and so on.

In one embodiment, bitstream router 146 can be a fixed router, i.e., the partition of the bitstreams $142_1$-$142_P$ into the first and second subsets is fixed and static.

In another embodiment, bitstream router 146 can be a reconfigurable router (e.g., a P×(U+V) switch). In this case, a control signal 144 generated by an appropriate electronic controller can be used to change the partition of the bitstreams $142_1$-$142p$ into the first and second subsets. For example, in various embodiments, bitstream router 146 may be designed to enable one or more partition changes from the following nonexclusive list: (i) changing the numbers U and/or V; (ii) moving one or more selected bitstreams 142 from the first subset to the second subset; (iii) moving one or more selected bitstreams 142 from the second subset to the first subset; (iv) dropping one or more selected bitstreams 142; and (v) adding a previously dropped bitstream 142 to either the first subset or the second sub set.

As a non-limiting example, FIG. 1 shows one possible configuration of bitstream router 146 corresponding to an even value of P, and the numbers U=V=P/2. In this configuration, the odd-indexed bitstreams 142 are directed to DAC 154, and the even-indexed bitstreams 142 are directed to DAC 156. More specifically, the bitstreams $142_1$, $142_3$, ..., and $142_{P-1}$ are directed to DAC 154 as bitstreams $148_1$, $148_2$, ..., and $148_U$, respectively. Similarly, the bitstreams $142_2$, $142_4$, ..., and $142_P$ are directed to DAC 156 as bitstreams $150_1$, $150_2$, ..., and $150_V$, respectively. Functionally, this routing configuration can be viewed as an operation that decomposes the digital waveform W(j) into two digital waveforms of lower (coarser) effective digital resolution. These two digital waveforms are combinable to fully or substantially fully reconstruct the corresponding original digital waveform W(j), i.e., the decomposition may be reversible. In an example embodiment, the above-described interleaved allocation of the bitstreams 142 to DACs 154 and 156 can beneficially result in a relatively small (e.g., approximately 6-dB) driving-power difference between the optical modulators 122 and 126, with this driving-power difference (expressed in dB) being substantially independent of the number P.

In at least some embodiments, bitstream router 146 can be configured (statically or dynamically) to implement one or more of the following routing features:

(A) at least one bitstream 142 of the first subset has relatively less-significant bits than at least one bitstream 142 of the second subset, and at least one bitstream 142 of the first subset has relatively more-significant bits than at least one bitstream 142 of the second subset;

(B) the first subset or the second subset includes both bitstream $142_1$ and bitstream $142_P$, i.e., both the MSBs and LSBs of the digital waveform We);

(C) the first subset has all odd-indexed bitstreams 142, and the second subset has all even-indexed bitstreams 142, e.g., bitstream router 146 acts as a de-interleaving de-multiplexer;

(D) one of the first and second subsets includes two bitstreams 142 separated in the index order by at least one bitstream 142 from another one of the first and second subsets; and (E) U≠V.

DAC 154 operates to convert the digital waveform applied thereto by the bitstreams $148_1$-$148_U$ into a corresponding analog waveform, thereby generating the electrical drive signal 114. In some embodiments, electrical drive signal 114 may be amplified and/or dc-biased to place optical modulator 122 into a proper operating point on its transfer function, e.g., as known in the pertinent art.

DAC 156 similarly operates to convert the digital waveform applied thereto by the bitstreams $150_1$-$150_V$ into a corresponding analog waveform, thereby generating electrical drive signal 116. In some embodiments, electrical drive signal 116 may also be amplified and/or dc-biased to place optical modulator 126 into a proper operating point on its transfer function, e.g., as known in the pertinent art.

In some embodiments, symbol mapper 136 may be omitted (not present). In such embodiments, N=M.

In some embodiments, waveform generator 140 may be omitted (not present). In such embodiments, P=N.

In some embodiments, both symbol mapper 136 and waveform generator 140 may be omitted (not present). In such embodiments, P=M.

In some embodiments, the number M is greater than six, i.e. M>6.

In some embodiments, optical modulator 120 can be modified in a relatively straightforward manner to have three or more optical modulators serially connected between laser 110 and the optical output port of transmitter 100 to which the external optical fiber line is connected. This modification may include (i) adding one or more DACs, e.g., one additional DAC per added, serially connected optical modulator and (ii) connecting bitstream router 146 to route some of the bitstreams 142 to the added DAC(s).

Figure 3:
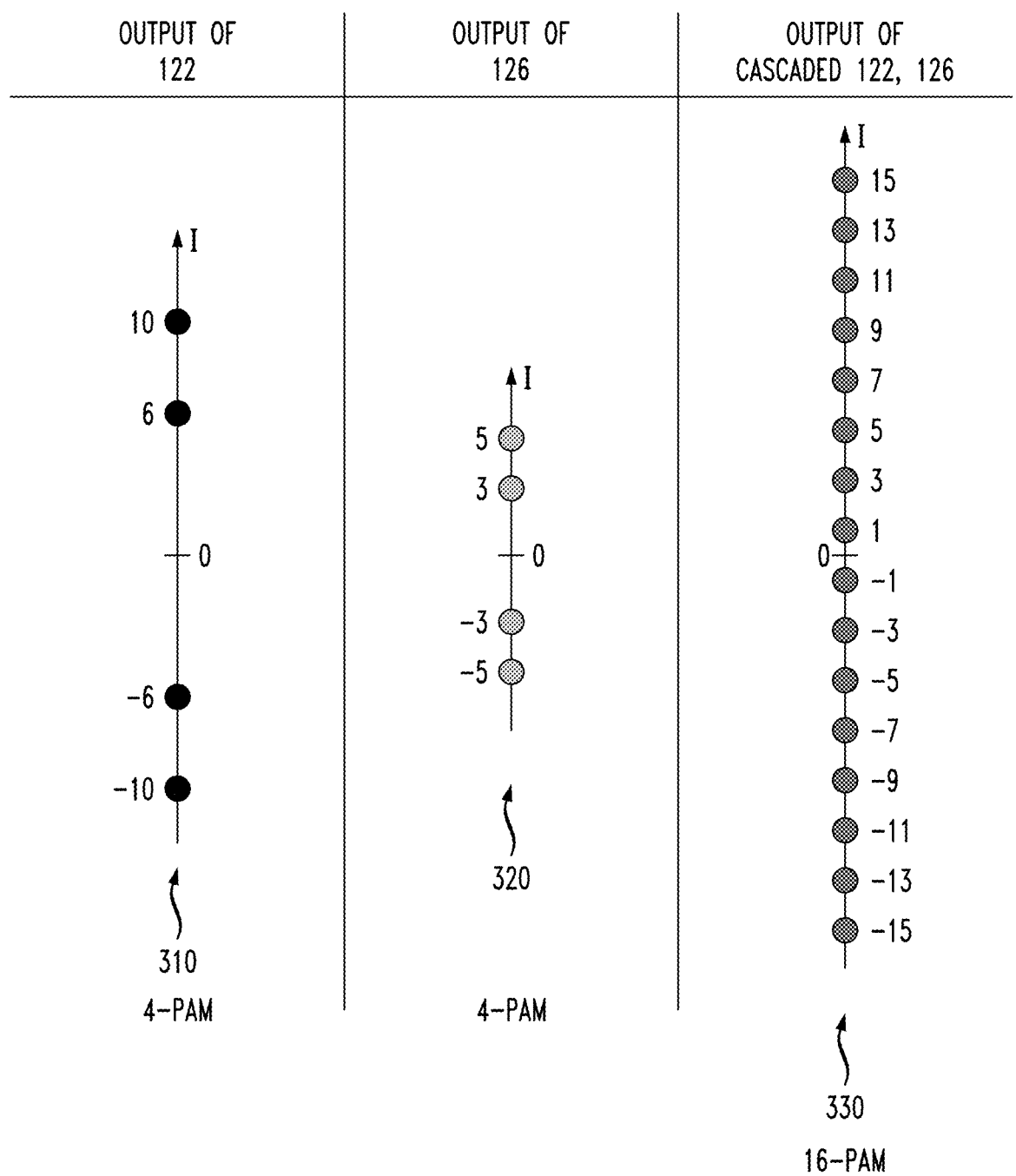
FIG. 3 graphically illustrates some features of optical modulators used in the optical data transmitter of FIG. 1 according to an embodiment.

FIG. 3 graphically illustrates some features of optical modulator 120 according to an embodiment. More specifically, the features illustrated in FIG. 3 correspond to an embodiment in which M=4 and optical modulators 122 and 126 of FIG. 1 are amplitude modulators. In this example, bitstream router 146 has a routing configuration analogous to that explicitly shown in FIG. 1.

The third (rightmost) column in FIG. 3 graphically shows the discrete amplitude levels of optical output signal 128 (also see FIG. 1). These amplitude levels are in accordance with the shown 16-PAM constellation 330. The corresponding sixteen amplitude values can be represented by the real numbers −15, −13, −11, ..., +13, +15, as indicated in FIG. 3.

The first (leftmost) column in FIG. 3 graphically shows the discrete amplitude levels of optical signal 124 outputted by the first optical modulator 122 of FIG. 1 when the optical carrier 112 is a continuous wave (CW) signal (also see FIG. 1). These amplitude levels are in accordance with the shown 4-PAM constellation 310. The corresponding four amplitude values can be represented by the real numbers −10, −6, +6, and +10, as indicated in FIG. 3.

The second (middle) column in FIG. 3 graphically shows the discrete amplitude levels of the optical signal outputted by the second optical modulator 126 (FIG. 1) when the optical input thereto is a CW signal. These amplitude levels are in accordance with the shown 4-PAM constellation 320. The corresponding four amplitude values can be represented by the real numbers −5, −3, +3, and +5, as indicated in FIG. 3. When optical modulator 126 so configured is connected to receive optical signal 124 illustrated in the first column of FIG. 3, e.g., from the first optical modulator 122 of FIG. 1, optical modulator 126 acts to split four ways each of the amplitude levels of said optical signal 124, thereby generating the optical output signal 128 illustrated in the third column of FIG. 3. For example, the amplitude level −10 is split four ways in this manner to produce the amplitude levels −15 (=−10−5), −13 (=−10−3), −7 (=−10+3), and −5 (=−10+5) for the optical output signal 128. The amplitude level −6 is similarly split four ways to produce the amplitude levels −11 (=−6−5), −9 (=−6−3), −3 (=−6+3), and −1 (=−6+5) for the optical output signal 128. Similar splitting is produced for the positive amplitudes +6 and +10 of said optical signal 124.

Note that the 4-PAM constellation 310 shown in the first column of FIG. 3 is non-uniformly spaced, i.e., different pairs of adjacent constellation points may have different respective spacings. For example, the two constellation points corresponding to the amplitude levels +6 and +10 have a relative spacing of four units, whereas the two constellation points corresponding to the amplitude levels +6 and −6 have a relative spacing of twelve units. This is a factor-of-three difference in the spacing. The 4-PAM constellation 320 shown in the second column of FIG. 3 is also non-uniformly spaced. For example, the two constellation points corresponding to the amplitude levels +3 and +5 have a relative spacing of two units, whereas the two constellation points corresponding to the amplitude levels +3 and −3 have a relative spacing of six units. In contrast, the 16-PAM constellation 330 shown in the third column of FIG. 3 is uniformly spaced, i.e., any pair of adjacent constellation points therein has the same spacing. In the shown example, this uniform (constant) spacing is two units.

A person of ordinary skill in the art will readily understand that similar non-uniformly spaced constellations can be used in an embodiment in which optical modulators 122 and 126 are phase modulators or in an embodiment in which optical modulators 122 and 126 are intensity modulators.

In one possible embodiment, the electrical drive signals 114 and 116 that can result in the optical signals corresponding to the two 4-PAM constellations shown in FIG. 3 may be generated as follows. The electrical drive circuit 130 shown in FIG. 1 can be modified to have both symbol mapper 136 and waveform generator 140 removed. As a result, bitstream router 146 is connected to receive the bitstreams $134_1$-$134_4$ (herein P=M=4, as already mentioned above). The configuration of bitstream router 146 may be similar to that explicitly shown in FIG. 1. In this configuration, bitstream router 146 directs the bitstreams $134_1$ and $134_3$ to DAC 154 and also directs the bitstreams $134_2$ and $134_4$ to DAC 156. DAC 154 is configured to generate the electrical drive signal 114 in accordance with Eq. (1):

$$V_1 = V_0 \times (8 \times (-1)^a + 2 \times (-1)^c) \quad (1)$$

where $V_1$ is the voltage of signal 114; $V_0$ is a constant; a is the bit value provided by the bitstream $134_1$; and c is the bit value provided by the bitstream $134_3$. DAC 156 is configured to generate the electrical drive signal 116 in accordance with Eq. (2):

$$V_2 = V_0 \times (4 \times (-1)^b + (-1)^d) \quad (2)$$

where $V_2$ is the voltage of signal 116; b is the bit value provided by the bitstream $134_2$; and d is the bit value provided by the bitstream $134_4$. It can easily be verified that nominally identical optical modulators 122 and 126 having a linear transfer function can produce the optical signals illustrated in the three columns of FIG. 3 when driven using the voltages $V_1$ and $V_2$ generated in accordance with Eqs. (1) and (2).

Figure 4:
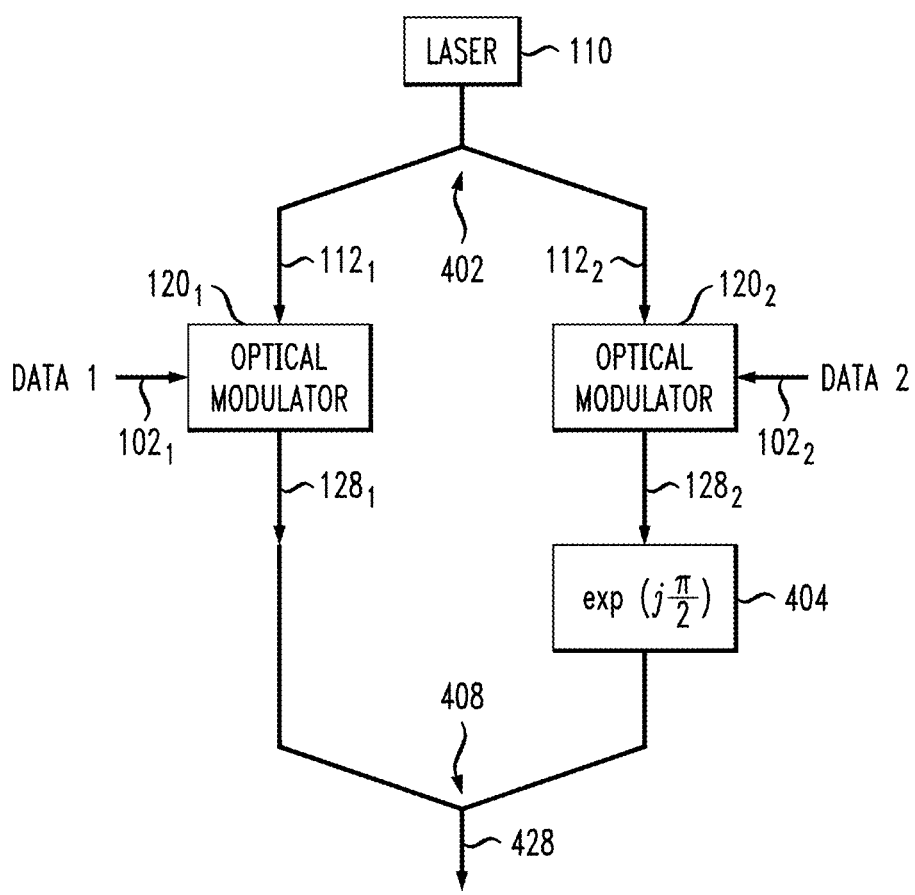
FIG. 4 shows a block diagram of an optical data transmitter according to another embodiment.

FIG. 4 shows a block diagram of an optical data transmitter 400 according to another embodiment, e.g., as an in-phase and quadrature-phase optical modulator. Transmitter 400 is constructed using many of the elements used in transmitter 100 (FIG. 1). These elements are labeled in FIG. 4 using the same reference numerals as in FIG. 1.

Transmitter 400 comprises two instances of optical modulator 120, which are labeled $120_1$ and $120_2$, respectively. In this embodiment, optical modulators $120_1$ and $120_2$ can be amplitude modulators connected in parallel between an optical splitter 402 and an optical combiner 408 as indicated in FIG. 4. Optical splitter 402 and optical combiner 408 can be implemented using nominally identical optical components, e.g., two instances of a symmetric 3-dB optical power splitter.

In operation, optical splitter 402 splits the optical output of laser 110 into two portions, which are labeled $112_1$ and $112_2$, respectively. Optical modulator $120_1$ modulates optical signal $112_1$ in response to an input data signal $102_1$, e.g., as described in reference to FIG. 1, thereby generating a corresponding modulated optical output signal $128_1$. Optical modulator $120_2$ similarly modulates optical signal $112_2$ in response to a different input data signal $102_2$, thereby generating a corresponding modulated optical output signal $128_2$. A phase shifter 404 applies about a 90-degree relative phase shift, e.g., with a precision of ±5 degrees or preferably ±1 degree, to signal $128_2$. Optical combiner 408 then combines the resulting phase-shifted signal with signal $128_1$, thereby generating a corresponding modulated optical output signal 428. The modulated optical output signal 428 can be applied, e.g., to an optical fiber line for transmission therethrough to a remote optical data receiver (not explicitly shown in FIG. 4).

In an example embodiment, optical modulator $120_1$ can be configured to generate the modulated optical output signal $128_1$ in accordance with an $M_1$-PAM constellation. Optical modulator $120_2$ can similarly be configured to generate the modulated optical output signal $128_2$ in accordance with an $M_2$-PAM constellation. A person of ordinary skill in the art will understand that, in this case, the corresponding modulated optical output signal 428 is generated in accordance with an $(M_1 \times M_2)$-QAM constellation. In some embodiments, the numbers $M_1$ and $M_2$ may be different. In some other embodiments, $M_1 = M_2$.

According to an example embodiment disclosed above, e.g., in the summary section and/or in reference to any one or any combination of some or all of FIGS. 1-4, provided is an apparatus comprising an optical data transmitter (e.g., 100, FIG. 1) that comprises first and second optical modulators (e.g., 122, 126, FIG. 1) and an electrical drive circuit (e.g., 130, FIG. 1), the first and second optical modulators being serially connected to generate a modulated optical signal (e.g., 128, FIG. 1; 428, FIG. 4) in response to a first electrical drive signal (e.g., 114, FIG. 1) applied to the first optical modulator and to a second electrical drive signal (e.g., 116, FIG. 1) applied to the second optical modulator; wherein the electrical drive circuit is configured to generate the first electrical drive signal using a first subset (e.g., $148_1$-$148_U$, FIG. 1) of an ordered set of parallel bitstreams (e.g., $142_1$-$142_P$, FIG. 1) and to generate the second electrical drive signal using a second non-overlapping subset (e.g., $150_1$-$150_U$, FIG. 1) of the ordered set, an order of the set being according to significance of the bitstreams to distances between data symbols carried by the modulated optical signal; and wherein one of the first and second subsets includes two of the bitstreams separated in said order by at least one bitstream from another one of the first and second subsets.

In some embodiments of the above apparatus, the electrical drive circuit is configured to generate the ordered set of parallel bitstreams in response to input data (e.g., 102, FIG. 1); and wherein the optical modulators are configured to produce the modulated optical signal to carry a sequence of constellation symbols encoding said input data.

In some embodiments of any of the above apparatus, the electrical drive circuit comprises a bitstream router (e.g., 146, FIG. 1) to route the first subset of the parallel bitstreams to a first digital-to-analog converter (e.g., 154, FIG. 1) and to route the second subset of the parallel bitstreams to a second digital-to-analog converter (e.g., 156, FIG. 1), the first digital-to-analog converter being configured to generate the first electrical drive signal in response to the first subset, the second digital-to-analog converter being configured to generate the second electrical drive signal in response to the second subset.

In some embodiments of any of the above apparatus, the bitstream router comprises a switch configured to change at least one of the first and second subsets in response to a control signal (e.g., 144, FIG. 1).

In some embodiments of any of the above apparatus, the first optical modulator is an optical amplitude modulator, an optical intensity modulator, or an optical phase modulator.

In some embodiments of any of the above apparatus, the second optical modulator is an optical amplitude modulator, an optical intensity modulator, or an optical phase modulator.

In some embodiments of any of the above apparatus, the electrical drive circuit comprises a serial-to-parallel converter (e.g., 132, FIG. 1) connected to output the ordered set of parallel bitstreams in response to input data (e.g., embodiment without 136 and 140, FIG. 1).

In some embodiments of any of the above apparatus, the electrical drive circuit comprises: a serial-to-parallel converter (e.g., 132, FIG. 1) connected to output a plurality of second parallel bitstreams (e.g., $134_1$-$134_M$, FIG. 1) in response to input data (e.g., 102, FIG. 1); and a digital circuit (e.g., 136/140, FIG. 1) configured to generate the ordered set of parallel bitstreams in response to the plurality of second parallel bitstreams.

In some embodiments of any of the above apparatus, the digital circuit comprises at least one of a symbol mapper (e.g., 136, FIG. 1) and a digital waveform generator (e.g., 140, FIG. 1).

In some embodiments of any of the above apparatus, the parallel bitstreams of the ordered set are clocked at a higher rate than the second parallel bitstreams.

In some embodiments of any of the above apparatus, the ordered set of parallel bitstreams has more bitstreams than the plurality of second parallel bitstreams (e.g., P>M, FIG. 1).

In some embodiments of any of the above apparatus, the electrical drive circuit is configured to operate at least one of the first and second optical modulators to produce at an optical output thereof symbols of a one-dimensional constellation (e.g., 310, 320, FIG. 3) whose symbols are non-uniformly spaced.

In some embodiments of any of the above apparatus, the modulated optical signal is generated to carry symbols of a one-dimensional constellation (e.g., 330, FIG. 3) whose symbols are uniformly spaced.

In some embodiments of any of the above apparatus, the two of the bitstreams are a bitstream of most-significant bits and a bitstream of least-significant bits.

In some embodiments of any of the above apparatus, the first and second subsets have odd-indexed first bitstreams and even-indexed first bitstreams, respectively, with bitstream indexing being consecutive and in said order.

In some embodiments of any of the above apparatus, the modulated optical signal is generated to carry symbols of a constellation whose symbols differ from one another in at least one of amplitude and phase.

In some embodiments of any of the above apparatus, the electrical drive circuit is configured to operate each of the first and second optical modulators to modulate an optical carrier according to a corresponding constellation (e.g., 310, 320, FIG. 3) whose symbols are non-uniformly spaced, the constellation corresponding to the first optical modulator having a different minimum spacing of symbols than the constellation corresponding to the second optical modulator.

In some embodiments of any of the above apparatus, bitstreams of the first subset are interleaved with bitstreams of the second subset in the order of the ordered set.

In some embodiments of any of the above apparatus, the optical data transmitter comprises a laser (e.g., 110, FIG. 1) connected to apply an optical carrier (e.g., 112, FIG. 1) to an optical input of the first optical modulator, the first optical modulator being operated to generate a corresponding modulated optical output signal (e.g., 124, FIG. 1) at an optical output thereof; and wherein the second optical modulator is connected to receive said corresponding modulated optical output signal at an optical input thereof, the second optical modulator being operated to further modulate said corresponding modulated optical output signal to generate a corresponding further-modulated optical signal (e.g., 128, FIG. 1) at an optical output thereof.

In some embodiments of any of the above apparatus, the modulated optical signal (e.g., 428, FIG. 4) comprises said corresponding further-modulated optical signal.

According to another example embodiment disclosed above, e.g., in the summary section and/or in reference to any one or any combination of some or all of FIGS. 1-4, provided is an apparatus comprising an optical data transmitter (e.g., 100, FIG. 1) that comprises first and second optical modulators (e.g., 122, 126, FIG. 1) and an electrical drive circuit (e.g., 130, FIG. 1), the first and second optical modulators being serially connected to generate a modulated optical signal (e.g., 128, FIG. 1; 428, FIG. 4) in response to a first electrical drive signal (e.g., 114, FIG. 1) applied to the first optical modulator and to a second electrical drive signal (e.g., 116, FIG. 1) applied to the second optical modulator; wherein the electrical drive circuit is configured to generate the first electrical drive signal using a first subset (e.g., $148_1$-$148_U$, FIG. 1) of an ordered set of parallel bitstreams (e.g., $142_1$-$142_P$, FIG. 1) and to generate the second electrical drive signal using a second subset (e.g., $150_1$-$150_U$, FIG. 1) of the ordered set, the first and second subsets being non-overlapping subsets, the parallel bitstreams being ordered in an order of relative bit significance; and wherein one of the first and second subsets includes two of the first bitstreams separated in said order by at least one bitstream from another one of the first and second subsets.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors," "controllers," and/or "digital circuits" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure.

What is claimed is:

1. An apparatus comprising an optical data transmitter that comprises first and second optical modulators and an electrical drive circuit, the first and second optical modulators being serially connected to generate a modulated optical signal in response to a first electrical drive signal applied to the first optical modulator and to a second electrical drive signal applied to the second optical modulator;

wherein the electrical drive circuit is configured to generate the first electrical drive signal using a first subset of an ordered set of parallel bitstreams and to generate the second electrical drive signal using a second non-overlapping subset of the ordered set, an order of the set being according to significance of the bitstreams to distances between data symbols carried by the modulated optical signal; and wherein one of the first and second subsets includes two of the bitstreams separated in said order by at least one bitstream from another one of the first and second subsets.

2. The apparatus of claim 1,
wherein the electrical drive circuit is configured to generate the ordered set of parallel bitstreams in response to input data; and
wherein the optical modulators are configured to produce the modulated optical signal to carry a sequence of constellation symbols encoding said input data.

3. The apparatus of claim 1, wherein the electrical drive circuit comprises a bitstream router to route the first subset of the parallel bitstreams to a first digital-to-analog converter and to route the second subset of the parallel bitstreams to a second digital-to-analog converter, the first digital-to-analog converter being configured to generate the first electrical drive signal in response to the first subset, the second digital-to-analog converter being configured to generate the second electrical drive signal in response to the second subset.

4. The apparatus of claim 3, wherein the bitstream router comprises a switch configured to change at least one of the first and second subsets in response to a control signal.

5. The apparatus of claim 1, wherein the electrical drive circuit comprises a serial-to-parallel converter connected to output the ordered set of parallel bitstreams in response to input data.

6. The apparatus of claim 1, wherein the electrical drive circuit comprises:
a serial-to-parallel converter connected to output a plurality of second parallel bitstreams in response to input data; and
a digital circuit configured to generate the ordered set of parallel bitstreams in response to the plurality of second parallel bitstreams.

7. The apparatus of claim 6, wherein the digital circuit comprises at least one of a symbol mapper and a digital waveform generator.

8. The apparatus of claim 6, wherein the parallel bitstreams of the ordered set are clocked at a higher rate than the second parallel bitstreams.

9. The apparatus of claim 6, wherein the ordered set of parallel bitstreams has more bitstreams than the plurality of second parallel bitstreams.

10. The apparatus of claim 1, wherein the electrical drive circuit is configured to operate at least one of the first and second optical modulators to produce at an optical output thereof symbols of a one-dimensional constellation whose symbols are non-uniformly spaced.

11. The apparatus of claim 10, wherein the modulated optical signal is generated to carry symbols of a one-dimensional constellation whose symbols are uniformly spaced.

12. The apparatus of claim 1, wherein the two of the bitstreams are a bitstream of most-significant bits and a bitstream of least-significant bits.

13. The apparatus of claim 1, wherein the first and second subsets have odd-indexed first bitstreams and even-indexed first bitstreams, respectively, with bitstream indexing being consecutive and in said order.

14. The apparatus of claim 1, wherein the electrical drive circuit is configured to operate each of the first and second optical modulators to modulate an optical carrier according to a corresponding constellation whose symbols are non-uniformly spaced, the constellation corresponding to the first optical modulator having a different minimum spacing of symbols than the constellation corresponding to the second optical modulator.

15. The apparatus of claim 1, wherein bitstreams of the first subset are interleaved with bitstreams of the second subset in the order of the ordered set.

16. The apparatus of claim 1,
wherein the optical data transmitter comprises a laser connected to apply an optical carrier to an optical input of the first optical modulator, the first optical modulator being operated to generate a corresponding modulated optical output signal at an optical output thereof; and
wherein the second optical modulator is connected to receive said corresponding modulated optical output signal at an optical input thereof, the second optical modulator being operated to further modulate said corresponding modulated optical output signal to generate a corresponding further-modulated optical signal at an optical output thereof.

17. The apparatus of claim 16, wherein the modulated optical signal comprises said corresponding further-modulated optical signal.

* * * * *